(12) United States Patent
Chen et al.

(10) Patent No.: US 8,050,790 B2
(45) Date of Patent: Nov. 1, 2011

(54) INDUCTOR/TRANSFORMER AND MANUFACTURING METHOD THEREOF

(75) Inventors: Sheng-Yow Chen, Hsinchu (TW); Kuo-Yu Tseng, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 197 days.

(21) Appl. No.: 12/264,532

(22) Filed: Nov. 4, 2008

(65) Prior Publication Data

US 2009/0115560 A1    May 7, 2009

(51) Int. Cl.
*G06F 19/00* (2011.01)

(52) U.S. Cl. .......................... 700/121; 700/51

(58) Field of Classification Search ............ 700/51, 700/95, 117, 121, 275; 703/13, 14, 15
See application file for complete search history.

(56) References Cited

U.S. PATENT DOCUMENTS 5,420,558 A    5/1995    Ito et al.

FOREIGN PATENT DOCUMENTS

| CN | 1536590 A | 10/2004 |
|---|---|---|
| WO | WO-2007/019280 A2 | 2/2007 |

OTHER PUBLICATIONS

Ilumoka et al., "Neural Network-Based Modeling & Design of On-Chip Spiral Inductors", pp. 561-564, IEEE 2004.*
"Inductance Optimization using 3D Field Solver based on Design Of Experiment Approach", Simulation Standard, Silvaco International, vol. 16, No. 2, pp. 1-5, Feb. 2006.*

* cited by examiner

*Primary Examiner* — Kakali Chaki
*Assistant Examiner* — Carlos Ortiz Rodriguez
(74) *Attorney, Agent, or Firm* — Rosenberg, Klein & Lee

(57) ABSTRACT

A manufacturing method for the inductor/transformer is disclosed. A simulator is used to simulate the inductance, the quality factor, and the self-resonance frequency of said inductor/transformer to generate at least one group of the area size, the number of the conductive layer, the line width, the number of turns, and/or the line space of the conductive layers and the first conductive layer; the inductor/transformer is manufactured according to the factors. Thereafter, the Monte-Carlo simulation is used to initiate the process variability analysis of the factors of the conductive layer and the first conductive layer, and the geometric size of the inductor/transformer can be modulated according to the results of the process variability analysis during the manufacturing process, such that the inductor/transformer can be manufactured by the process of the generic logic circuit.

6 Claims, 8 Drawing Sheets

INDUCTOR/TRANSFORMER AND MANUFACTURING METHOD THEREOF

BACKGROUND OF THE INVENTION

1. Technical Field

The present invention is related to an inductor/transformer and the manufacturing method thereof, wherein the inductance, quality factor, and self-resonance frequency of the inductor/transformer can be input into a simulator to proceed with the simulation process.

2. Description of the Prior Art

The wide application of the wireless communication device improves the manufacturing process and the design of the RFIC, such as the reduction of chip size, improvement of the yield, and so on. In general, transistors and passive elements, such as inductors, play an essential role in the RFIC; for example, the inductor is provided within the filter and the amplifier of the RFIC.

In the design and manufacturing processes of the circuit, it is of great importance to consider the inductance, quality factor (Q), and self-resonance frequency (Fsr) of the inductor. For example, an inductor with a high quality factor can store more energy and reduce electronic noise; moreover, the inductance and quality factor (Q) correlate closely with the self-resonance frequency (Fsr) of the inductor, such that the inductance, quality factor (Q), and self-resonance frequency (Fsr) of the inductor are usually limited in specific scope according to the demand of the circuit.

In traditionally, the inductance, quality factor (Q), and self-resonance frequency (Fsr) of the inductor are extracted from network synthesizer. Thereafter, the designer can select the proper inductor according to the measured inductance, quality factor (Q), and self-resonance frequency Fsr(Fsr).

One major drawback of foregoing the mentioned embodiment is the cost of the manufacturing process; it cannot be reduced because of the manufacturing and measuring of a variety of inductors. Furthermore, the thickness of the conductive layer within the inductor is increased in order to improve the quality factor of the inductor, and it is more difficult to manufacture the inductor by way of the generic logic circuit process.

SUMMARY OF THE INVENTION

It is the primary objective of the present invention to provide a manufacturing process for the inductor/transformer, wherein the inductance, quality factor (Q), and self-resonance frequency (Fsr) of the inductor/transformer can be inputted into the simulator for synthesizing and generating at least one group of the area size (X, Y), the number of the conductive layer (L), the line width (W), the number of turns (T), and/or the line space (S) of the conductive layer and the first conductive layer, such that the thicknesses of the first conductive layer and the other conductive layer are smaller than 1 µm.

It is a secondary objective of the present invention to provide a manufacturing process for the inductor/transformer, wherein the Monte-Carlo simulation is used to initiate a process variability analysis of the manufactured inductor/transformer, such that the factor of the inductor/transformer can be modulated according to the result of the process variability analysis.

It is another objective of the present invention to provide an inductor/transformer, wherein the thicknesses of the first conductive layer and the other conductive layer are both smaller than 1 µm, so that the inductor/transformer can be manufactured by the process of the generic logic circuit.

It is still another objective of the present invention to provide an inductor/transformer, wherein a floating pattern shield is provided on the substrate of the inductor/transformer for reducing substrate loss.

It is still another objective of the present invention to provide an inductor/transformer, wherein the RFIC and the high-density digital circuit can be integrated into a System on Chip (SoC) by way of the generic logic circuit process.

It is still another objective of the present invention to provide an inductor/transformer, wherein the process variability analysis can be initiated according to the process variation of the semiconductor, the packaging material, and the Si chip stacked on the Si chip with the inductor/transformer within the System in Package (SiP) for generating a result for the process variability analysis.

According to the above objectives, a manufacturing method for the inductor/transformer, wherein the inductor/transformer comprises a stack of a conductive layer and a first conductive layer, is comprised of: inputting the inductance, the quality factor, and the self-resonance frequency of the inductor/transformer into a simulator; analyzing the inductance, the quality factor, and the self-resonance frequency of the inductor/transformer to generate at least one group of the area size, the number of the conductive layer, the line width, the number of turns, and/or the line space of the conductive layer and the first conductive layer by the simulator; manufacturing the inductor/transformer according to the area size, the number of the conductive layer, the line width, the number of turns, and/or the line space of the conductive layer and the first conductive layer; proceeding a process variability analysis of the manufactured inductor/transformer according to a Monte-Carlo simulation to generate a result for the process variability analysis; and modulating the area size, the number of the conductive layer, the line width, the number of turns, and/or the line space of the conductive layer and the first conductive layer according to the result of the process variability analysis during the manufacturing process.

According to the above objectives, an inductor/transformer is comprised of: a substrate; at least one conductive layer provided on the substrate; and a first conductive layer stacked on the conductive layer, wherein the thicknesses of the conductive layer and the first conductive layer are both smaller than 1 µm.

The present invention can be best understood through the following description and accompanying drawings.

DETAILED DESCRIPTION OF THE PREFERRED EMBODIMENTS

Figure 1A:
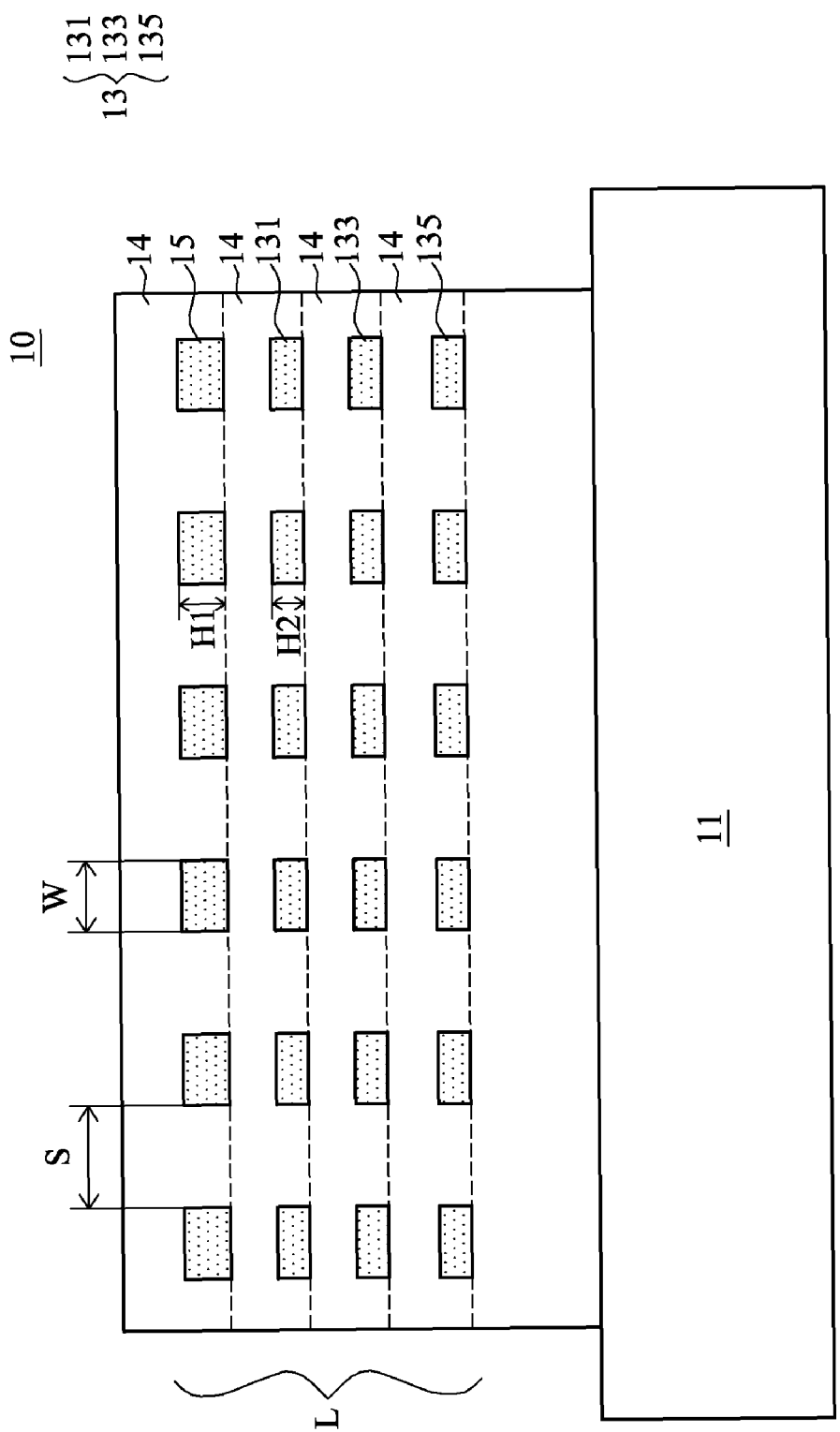
FIG. 1A and FIG. 1B are a cross-sectional view and a top view, respectively, of the inductor/transformer according to an embodiment of the present invention.
Figure 1B:
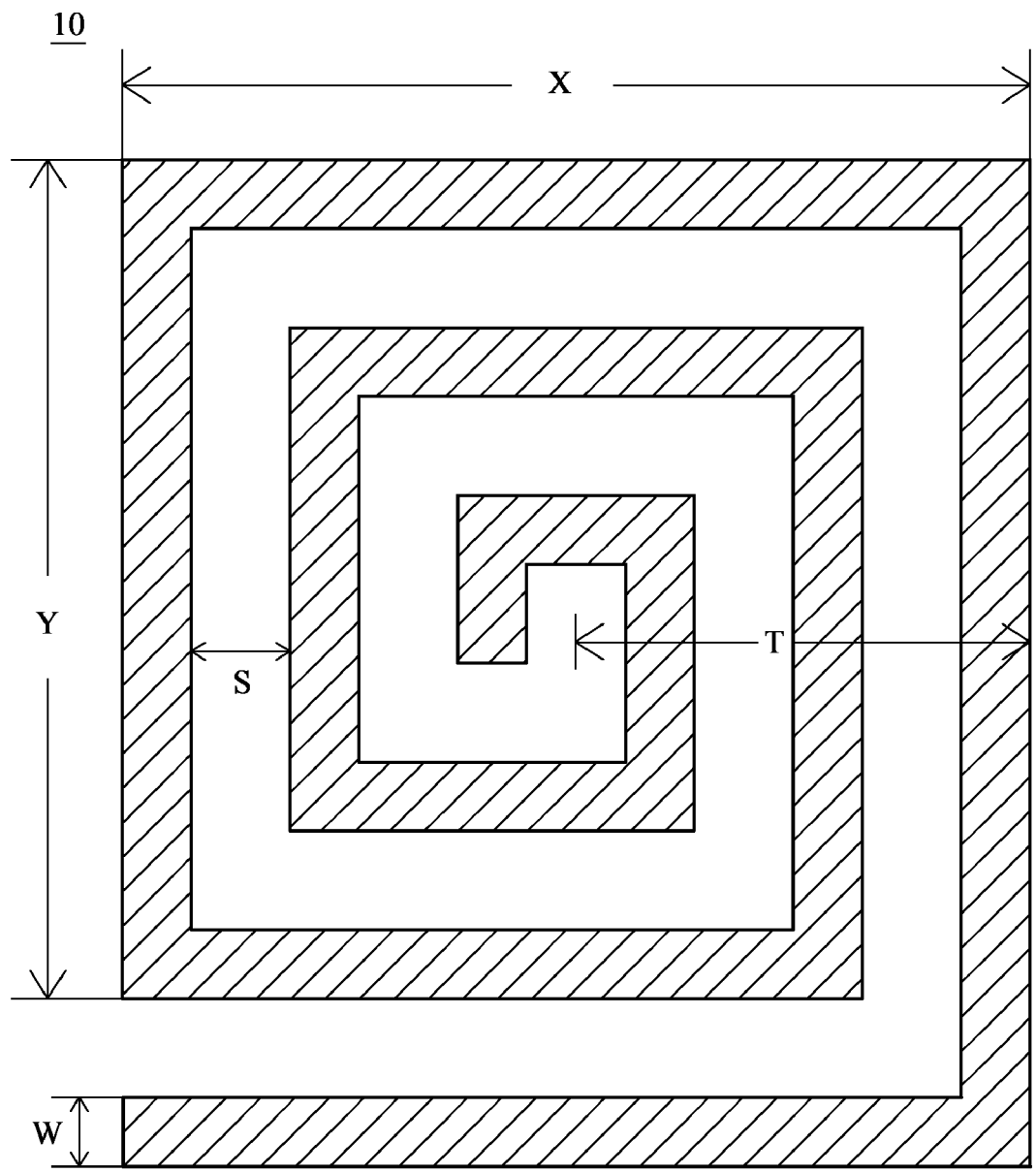
Figure 2:
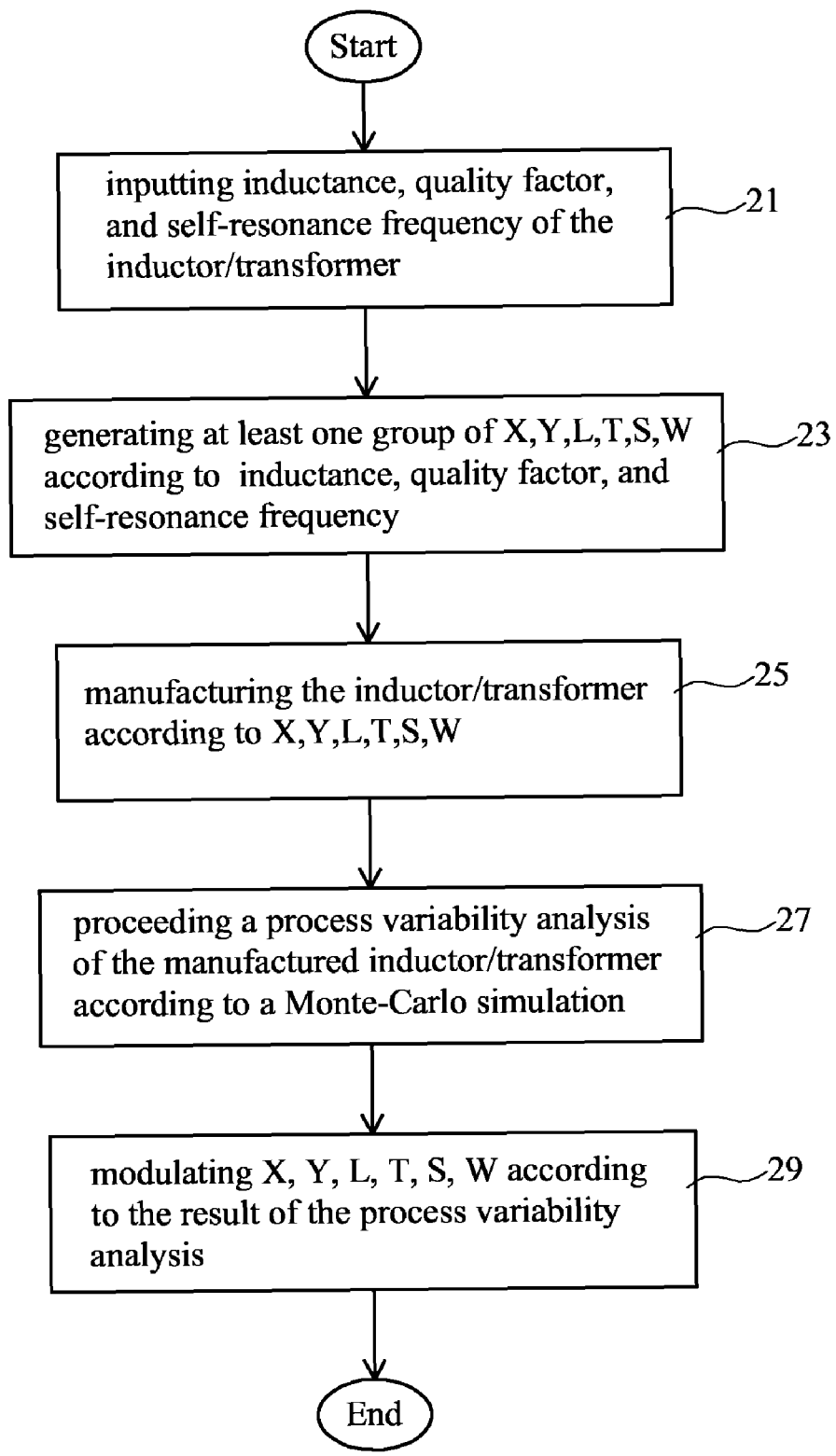
FIG. 2 is a flow chart illustrating the manufacturing process of the inductor/transformer according to an embodiment of the present invention.

Referring to FIG. 1A, FIG. 1B, and FIG. 2, a cross-sectional view, a top view, and a flow chart illustrating the manufacturing process of the inductor/transformer according to an embodiment of the present invention, respectively, is disclosed. The inductor/transformer 10 comprises a substrate 11, at least one conductive layer 13, and a first conductive layer 15, wherein the conductive layer 13 is provided on the substrate 11, and the first conductive layer 15 is stacked on the conductive layer 13; moreover, the thicknesses (H1/H2) of the conductive layer 13 and the first conductive layer 15 are both smaller than 1.0 μm.

A dielectric layer 14 is provided between the conductive layer 13 and the first conductive layer 15; furthermore, the dielectric layer 14 can be provided between the adjacent conductive layer 13, while the number of the conductive layer 13 is plurality. For example, the conductive layer 13 comprises a second conductive layer 131, a third conductive layer 133, and a fourth conductive layer 135, and the dielectric layer 14 is provided for each conductive layer 131/133/135. Moreover, each conductive layer 13 can be electrically connected with each other; as well, the conductive layer 13 can be electrically connected to the first conductive layer 15. As such, the conductive layer 13 is connected to the first conductive layer 15 in parallel or in series, and each conductive layer 13 is connected with each other in parallel or in series.

The factors, such as the area size (X, Y), the number of the conductive layer (L), the line width (W), the number of turns (T), and/or the line space (S), of the first conductive layer 15 and the conductive layer 13 of the inductor/transformer 10 can be modulated during the manufacturing process in order to receive a group of proper inductance, quality factor (Q), and self-resonance frequency (Fsr), wherein the number of the conductive layer (L) is the sum of the conductive layer 13 and the first conductive layer 15. That is, the inductance, the quality factor (Q), and the self-resonance frequency (Fsr) of the inductor/transformer 10 can be adjusted according to these factors.

The number of groups of the inductance, quality factor (Q), and self-resonance frequency (Fsr) of the inductor/transformer 10 can be a plurality, and one group of the inductance, quality factor (Q), and the self-resonance frequency (Fsr) can be selected from those groups and inputted into a simulator. For example, the simulator comprises a software program, and a grouping of the inductance, quality factor (Q), and self-resonance frequency (Fsr), can be inputted into the software program, as shown in step 21.

The simulator can analyze and synthesize the inputted inductance, quality factor (Q), and self-resonance frequency (Fsr), to generate at least one group of the area size (X,Y), the number of the conductive layer (L), the line width (W), the number of turns (T), and/or the line space (S) of the conductive layer 13 and the first conductive layer 15, as shown in step 23. Thereafter, the inductor/transformer 10 can be manufactured according to the area size (X, Y), the number of the conductive layer (L), the line width (W), the number of turns (T), and/or the line space (S) of the conductive layer 13 and the first conductive layer 15, as shown in step 25.

The thicknesses of the conductive layer 13 and the first conductive layer 15 can be smaller than 1 μm in accordance with selecting one group of the area size (X,Y), the number of the conductive layer (L), the line width (W), the number of turns (T), and/or the line space (S). Furthermore, as the thicknesses of the first conductive layer 15 (H1) and the conductive layer 13 (H2) are both smaller than 1.0 μm, the process of the generic logic circuit can be used to manufacture the inductor/transformer 10 with a high quality factor (Q) and high inductance. In one embodiment, the thickness of the first conductive layer 15 can be slightly larger than the conductive layer 13, such as the thickness H1 of the first conductive layer 15 is slightly larger than the thickness H2 of the conductive layer 13.

The Monte-Carlo simulation can be used to initiate the process variability analysis of the manufactured inductor/transformer 10 during the manufacturing process of the inductor/transformer 10. For example, the Monte-Carlo simulation can be used to initiate the process variability analysis of the inductance, quality factor (Q), and self-resonance frequency (Fsr) of the inductor/transformer 10 to obtain a result from the process variability analysis, such that the distribution of the inductance, quality factor (Q), and self-resonance frequency (Fsr) of the manufactured inductor/transformer 10 can be obtained, as shown in the step 27.

In addition, the process conditions of the inductor/transformer 10 can be adjusted according to the result of the process variability analysis of the inductor/transformer 10. For example, the area size (X, Y), the number of the conductive layer (L), the line width (W), the number of turns (T), and/or the line space (S) of the conductive layer 13 and the first conductive layer 15, can be adjusted according to the distribution of inductance, quality factor (Q), and self-resonance frequency (Fsr) for improving the yield of the inductor/transformer 10, as shown in step 29.

The simulator can be used to generate a plurality of groups of the area size (X,Y), the number of the conductive layer (L), the line width (W), the number of turns (T), and/or the line space (S) of the conductive layer 13 and the first conductive layer 15 according to the inputted inductance, quality factor (Q), and self-resonance frequency (Fsr). Furthermore, one group of area size (X, Y), the number of the conductive layer (L), the line width (W), the number of turns (T), and/or the line space (S) can be selected to begin the manufacturing process of the inductor/transformer 10.

The simulator can comprise a software program and a database; the database comprises an abundance of relations between the factors (X, Y, L, W, T, S) and the groups of the inductance, the quality factor (Q) and the self-resonance frequency (Fsr), such that the software program can be used to compare the inputted conditions with the database to obtain a corresponding group of the area size (X, Y), the number of the conductive layer (L), the line width (W), the number of turns (T), and/or the line space (S). Moreover, the database can comprise a plurality of foregoing mentioned results of the process variability analysis, such that the ease of use will be greatly improved.

Figure 3:
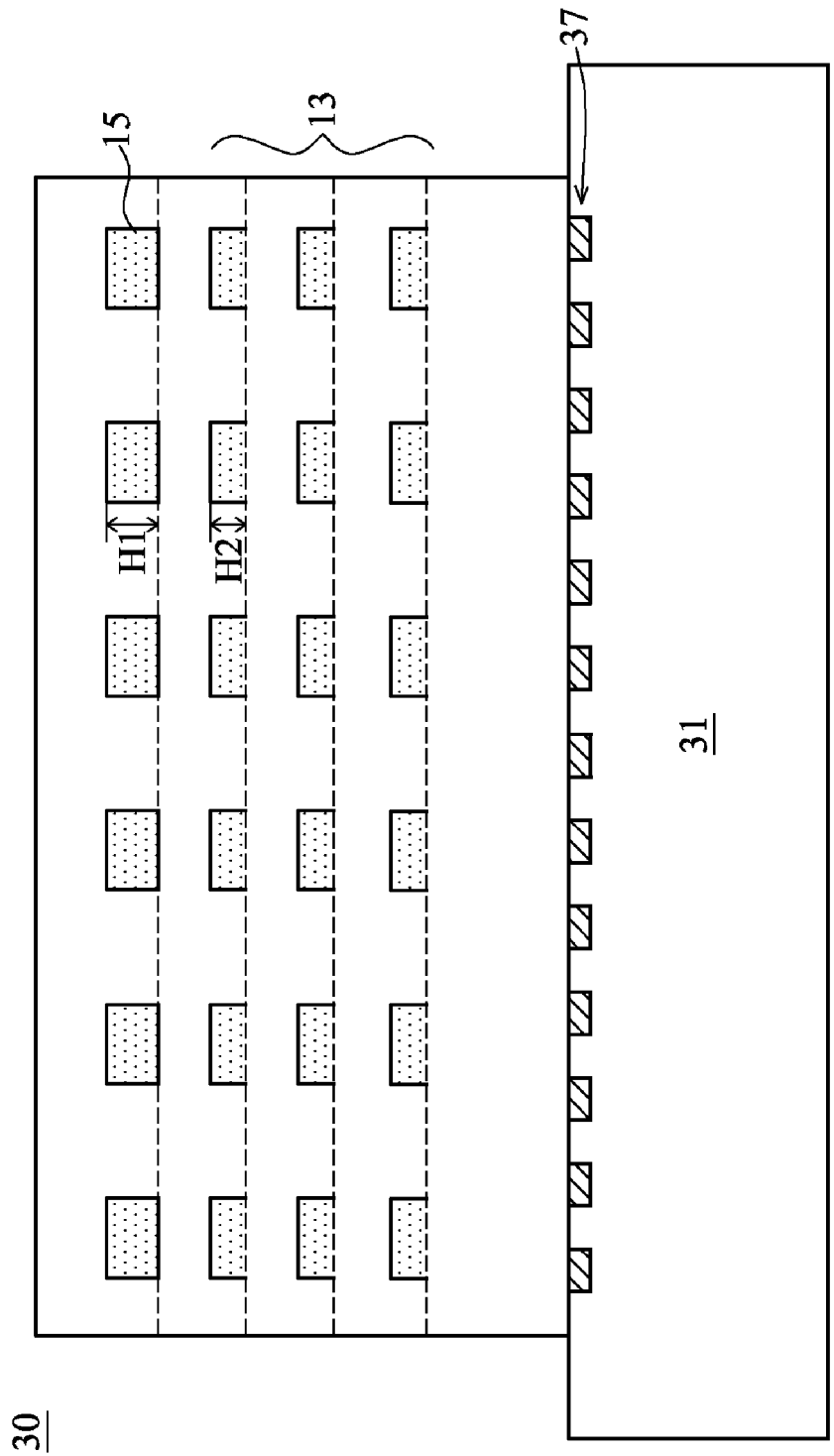
FIG. 3 is a cross-sectional view of the inductor/transformer according to another embodiment of the present invention.

Referring to FIG. 3, a cross-sectional view of the inductor/transformer according to another embodiment of the present invention is disclosed. The inductor/transformer 30 comprises a substrate 31, a conductive layer 13, and a first conductive layer 15, wherein the thicknesses of the conductive layer 13 and the first conductive layer 15 are both smaller than 1 μm, and a floating pattern shield 37 is provided on the substrate 31 for reducing the substrate loss and improving the quality factor of the inductor/transformer 30.

The floating pattern shield 37 is a pattern structure that is formed on the surface of the substrate 31 by which the substrate 31 can be divided into a plurality of non-continuous blocks to reduce the flow path and value of the eddy current formed on the substrate 31, such that the energy loss of the inductor/transformer 30 can be reduced, and the quality factor (Q) of the inductor/transformer 30 can be improved.

Figure 4:
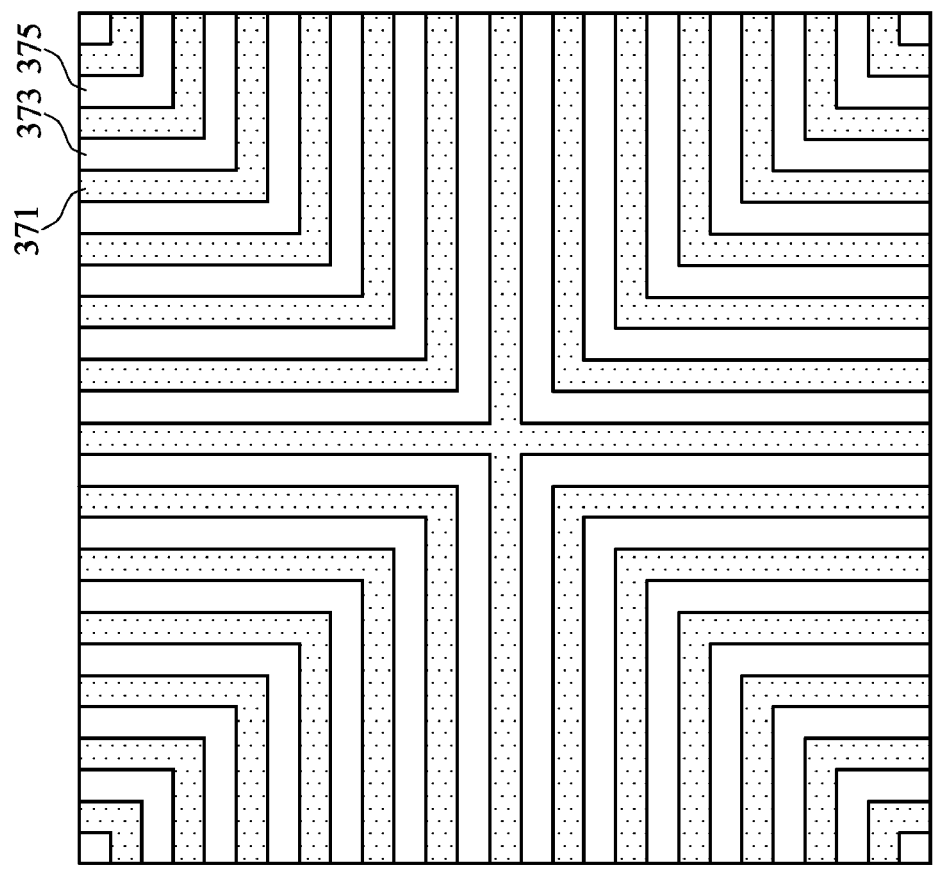
FIG. 4 is a top view of the floating pattern shield of the inductor/transformer according to another embodiment of the present invention.
Figure 5:
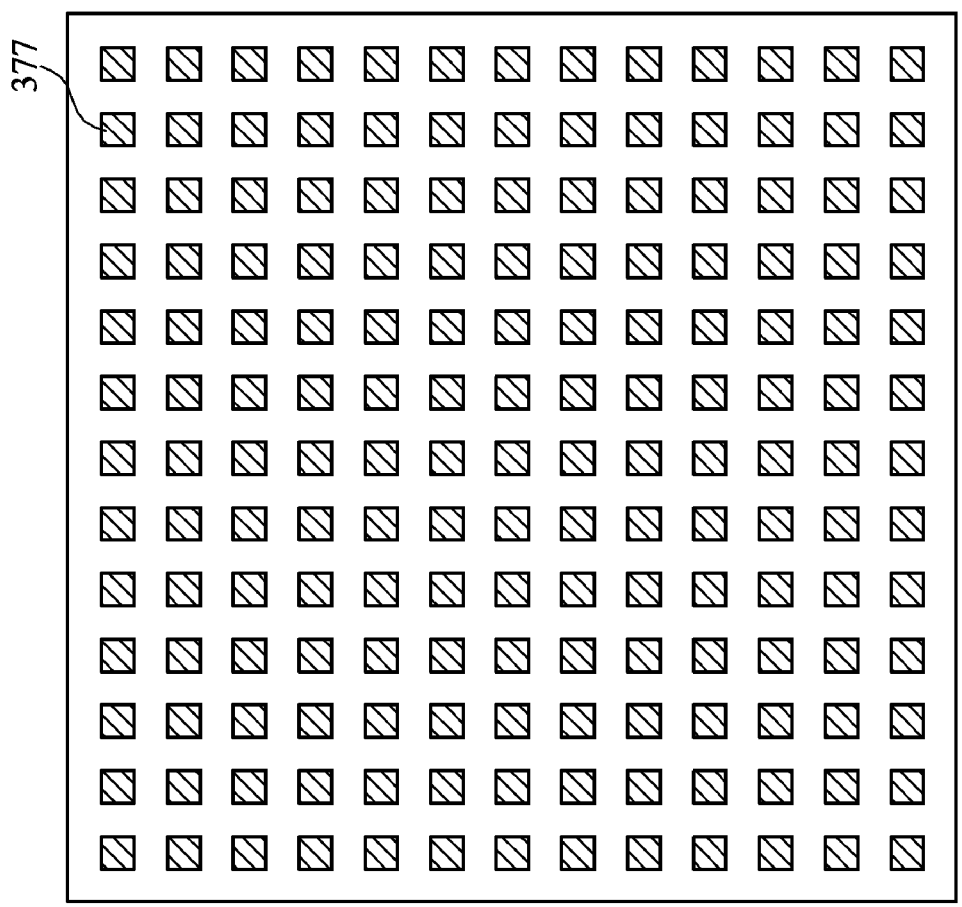
FIG. 5 is a top view of the floating pattern shield of the inductor/transformer according to another embodiment of the present invention.

The geometric shape of the floating pattern shield 37 can vary; furthermore, the floating pattern shield 37 comprises a plurality of trench isolation 371 and/or floating P/N junction, as shown in FIG. 4. For example, the trench isolation 371 is provided between the P well 373 and the N well 375, wherein the P well 373 can be P+, the N well can be N+ or deep N well, and the trench isolation 371 can be made of silicon dioxide. Alternatively, the floating pattern shield 37 comprises a plurality of floating metal poles 377, as shown in FIG. 5, such that the eddy current can be constrained within the floating metal poles 377, which minimizes the flow paths of the eddy current.

Figure 6:
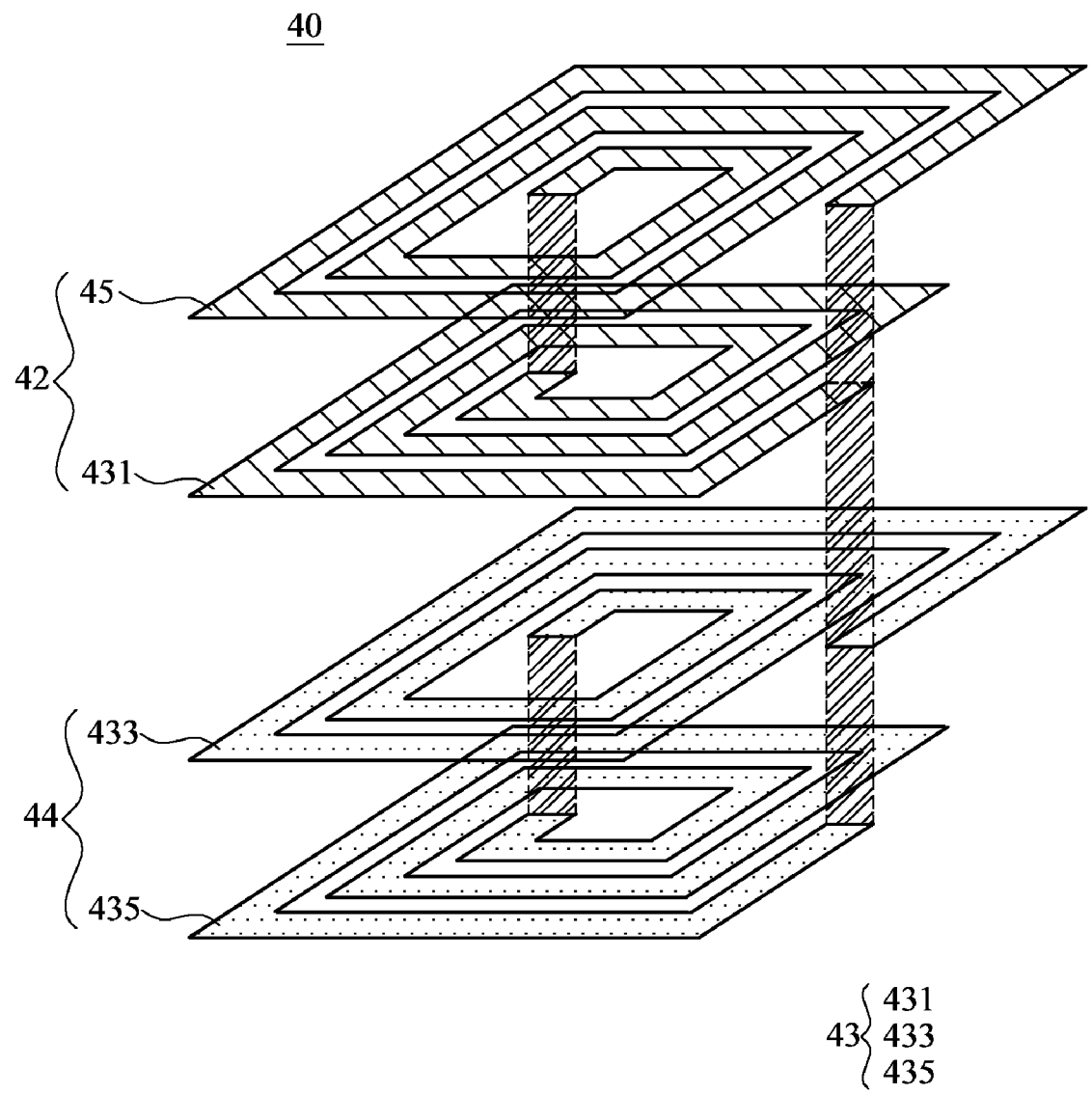
FIG. 6 is a block diagram of the inductor/transformer according to another embodiment of the present invention.
Figure 7:
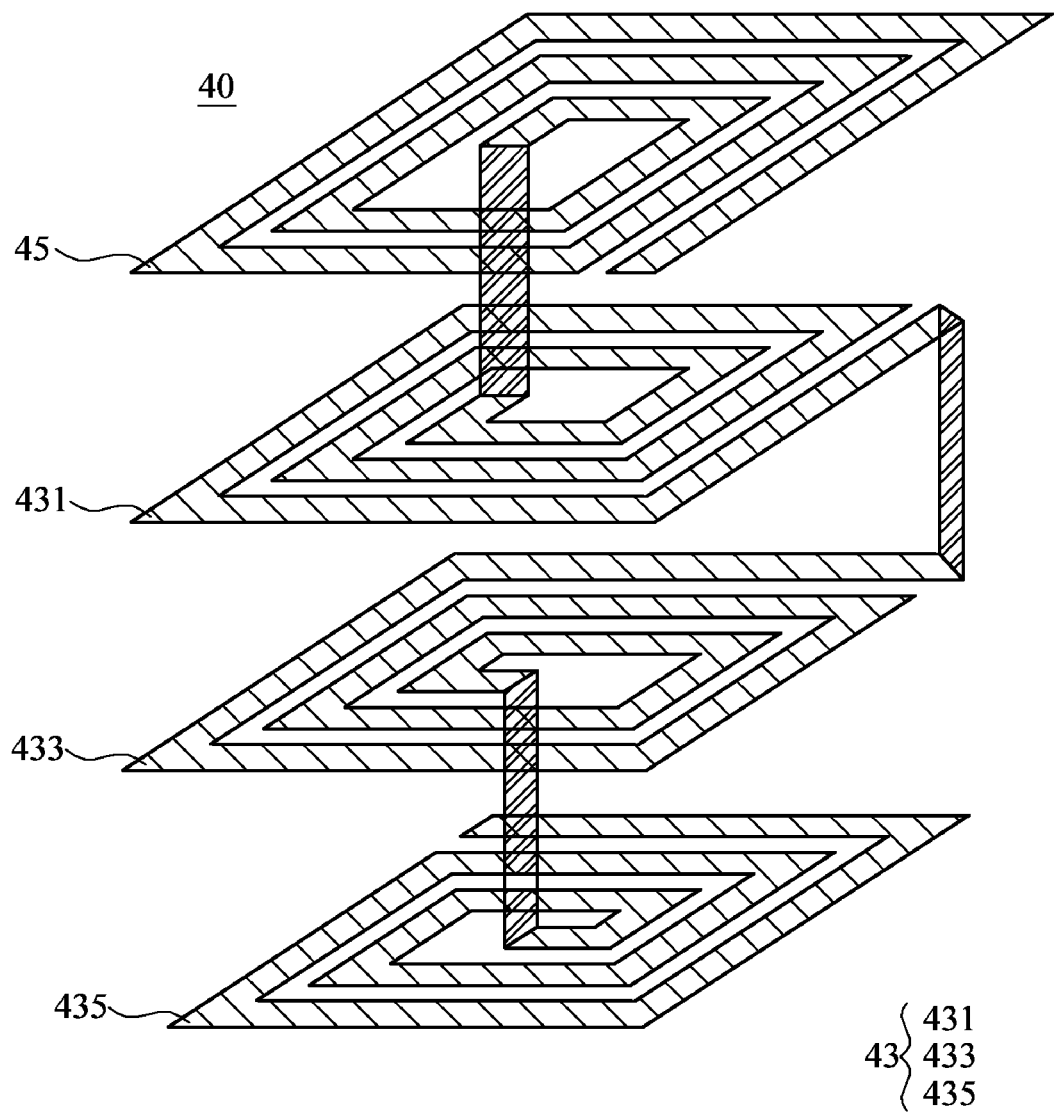
FIG. 7 is a block diagram of the inductor/transformer according to another embodiment of the present invention.

Referring to FIG. 6 and FIG. 7, block diagrams of the inductor/transformer according to another embodiment of the present invention are disclosed. The inductor/transformer 40 comprises a first conductive layer 45 and at least one conductive layer 43, wherein the first conductive layer 45 is similar with the conductive layer 43 in geometric shape. For example, the conductive layer 43 comprises a second conductive layer 431, a third conductive layer 433, and a fourth conductive layer 435; furthermore, the thicknesses of the first conductive layer 45, the second conductive layer 431, the third conductive layer 433, and the fourth conductive layer 435 are all smaller than 1 µm.

The characterization of the inductor/transformer 40 can be altered according to the connection relation among the first conductive layer 45, the second conductive layer 431, the third conductive layer 433, and the fourth conductive layer 435. For example, the first conductive layer 45 and the second conductive layer 431 are connected in parallel to form a first conductive block 42; as well, the third conductive layer 433 and the fourth conductive layer 435 are connected in parallel to form a second conductive block 44, wherein the first conductive block 42 and the second conductive block 44 are connected in series, as shown in FIG. 6. Alternatively, the first conductive layer 45, the second conductive layer 431, the third conductive layer 433, and the fourth conductive layer 435 are connected in series, as shown in FIG. 7.

The above embodiments are only used to illustrate the present invention, and not intended to limit the scope thereof. Many modifications of the above embodiments can be made without departing from the spirit of the present invention.

What is claimed is:

1. A manufacturing method of an inductor or a transformer, wherein said inductor or transformer comprises a substrate, a stack of conductive layers, and a first conductive layer, wherein said conductive layers are on the substrate and said first conductive layer is on said conductive layers, comprising the steps of:
   inputting the inductance, the quality factor, and the self-resonance frequency of said inductor or transformer into a simulator;
   analyzing the inductance, the quality factor, and the self-resonance frequency of said inductor or transformer to generate, by said simulator, at least one group including: the area size, the number of conductive layers, the line width, and the number of turns, or to generate, by said simulator, at least one group including: the area size, the number of conductive layers, the line width, the number of turns, and the line space of said conductive layers and said first conductive layer;
   manufacturing said inductor or transformer according to the area size, the number of conductive layers, the line width, and the number of turns, or according to the area size, the number of conductive layers, the line width, the number of turns, and the line space of said conductive layers and said first conductive layer;
   proceeding with a process variability analysis of the manufactured inductor or transformer according to a Monte-Carlo simulation to generate a result for said process variability analysis; and
   modulating the area size, the number of conductive layers, the line width, and the number of turns, or modulating the area size, the number of conductive layers, the line width, the number of turns, and the line space of said conductive layers and said first conductive layer, according to said result of said process variability analysis of the manufactured inductor or transformer;
   wherein the total thickness of said conductive layers, and said first conductive layer is less than 1 µm, and the number of conductive layers is the sum of said conductive layers and the first conductive layer.

2. The manufacturing method of claim 1, comprising the steps of:
   proceeding with said process variability analysis according to said Monte-Carlo simulation to obtain a distribution of the inductance, the quality factor, and the self-resonance frequency of said inductor or transformer.

3. The manufacturing method of claim 2, comprising the steps of:
   modulating the area size, the number of conductive layers, the line width, and the number of turns of the manufactured inductor or transformer, or modulating the area size, the number of conductive layers, the line width, the number of turns, and the line space of said conductive layers and said first conductive layer of the manufactured inductor or transformer, according to the distribution of the inductance, the quality factor, and the self-resonance frequency of said inductor or transformer.

4. The manufacturing method of claim 1, wherein said simulator comprises a software program and a database.

5. The manufacturing method of claim 4, wherein said database comprises said result of said process variability analysis.

6. The manufacturing method of claim 1, wherein said simulator is used to obtain a plurality of groups, each group including the area size, the number of conductive layers, the line width, and the number of turns, or each group including the area size, the number of conductive layers, the line width, the number of turns, and the line space of said conductive layers and said first conductive layer.

* * * * *